United States Patent [19]

Ellis

[11] Patent Number: 4,550,836
[45] Date of Patent: Nov. 5, 1985

[54] CLAMP ARRANGEMENTS

[75] Inventor: Stafford M. Ellis, West Sussex, England

[73] Assignee: Marconi Avionics Limited, England

[21] Appl. No.: 591,582

[22] Filed: Mar. 20, 1984

[30] Foreign Application Priority Data

Apr. 5, 1983 [GB] United Kingdom ............... 8309170

[51] Int. Cl.⁴ ............................................. H05K 7/14
[52] U.S. Cl. ............................... 211/41; 339/75 MP; 361/386
[58] Field of Search .................... 211/41, 45; 248/27.1, 248/231.3; 361/386, 415; 339/75 M, 75 MP, 75 R; 24/523, 498, 524

[56] References Cited

U.S. PATENT DOCUMENTS

| | | | |
|---|---|---|---|
| 3,451,034 | 6/1969 | Beale | 211/41 X |
| 3,665,370 | 5/1972 | Hartmann | 339/75 MP |
| 3,970,198 | 7/1976 | Prater | 211/41 |
| 3,975,805 | 8/1976 | Spurling et al. | 211/41 X |
| 3,982,807 | 9/1976 | Anhalt et al. | 339/75 MP |
| 4,214,292 | 7/1980 | Johnson | 211/41 X |

FOREIGN PATENT DOCUMENTS 2103883 2/1983 United Kingdom .

Primary Examiner—Robert W. Gibson, Jr.
Attorney, Agent, or Firm—Kirschstein, Kirschstein, Ottinger & Israel

[57] ABSTRACT

A clamp arrangement for clamping a marginal portion of a board between two opposed substantially flat parallel walls. The mechanism is mounted on the board and is arranged to be capable of expansion in a direction normal to the board. The mechanism comprises an elongate spring strip extending in the direction of its length along the marginal portion, and having corrugations transverse to its length. An elongate cam overlies the spring strip, the cam having a plurality of cam surfaces along its length spaced apart at the same pitch as the spring strip corrugations. Clamping is obtained by sliding the cam relative to the spring strip bringing the cam surfaces into contact with the corrugations, thus causing expansion of the mechanism and subsequent pressure on the two opposed walls due to compression of the spring corrugations.

9 Claims, 6 Drawing Figures

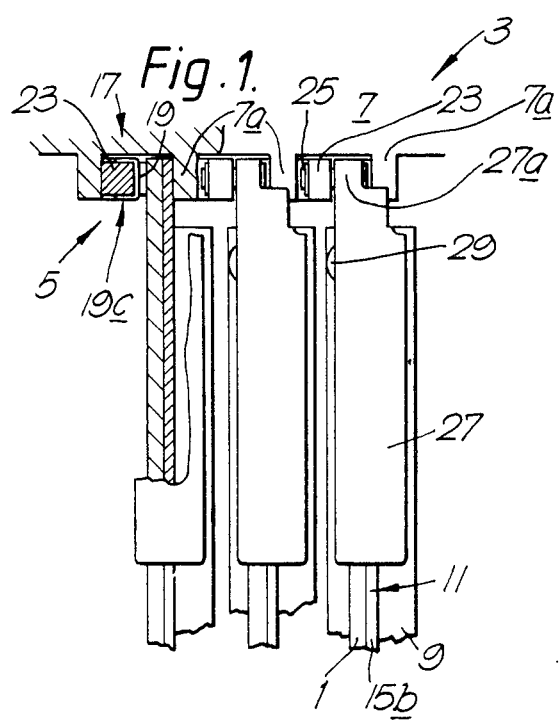
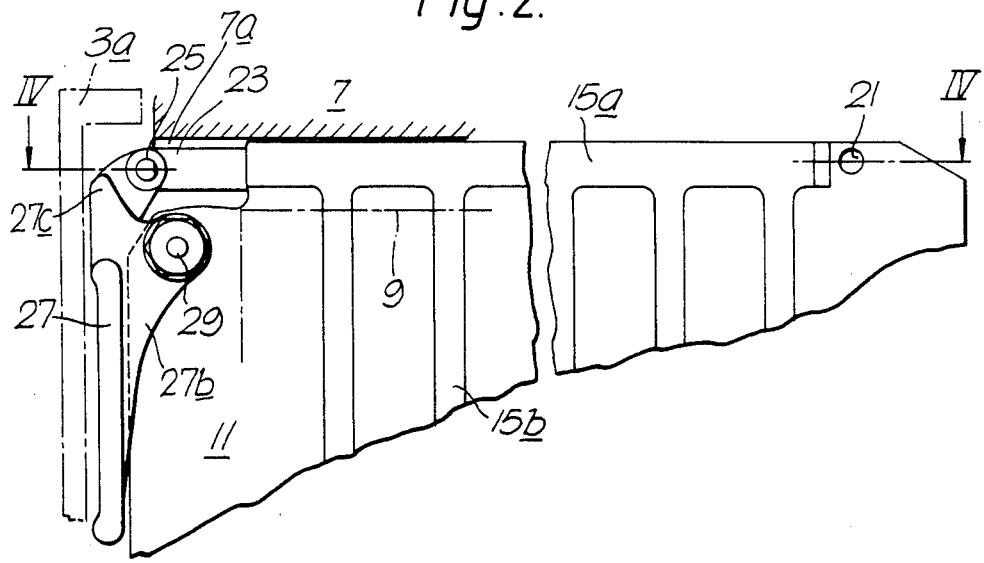

CLAMP ARRANGEMENTS

This invention relates to clamp arrangements and has especial relevance to clamp arrangements for securing parts in good thermal contact.

There exist many examples of clamp arrangements for securing printed circuit boards in good thermal contact with cold walls. It is the common practice to provide cold walls having pairs of opposed slots into which the lateral margins of printed circuit boards are inserted. The boards often carry a heat conductive ladder, the cross members of which are in close proximity to the electronic components mounted on the board, and the side members of which lie on the lateral margins of the board. A mechanism is provided which, when the board is within the opposed slots, serves to bias the board so that at least one of the side members of the heat conductive ladder makes good thermal contact with a side wall of the slot in the cold wall which it is within.

In UK patent application No. 2,103,883A there is described such a clamp arrangement which includes a mechanism mounted on a major surface of the board adjacent to a lateral margin of the board, the mechanism being capable of expansion in a direction normal to the major surface. The mechanism includes an elongate resilient element extending along the direction of its length along the marginal portion, and having corrugations transverse to its length. An elongate cam having a longitudinal axis extending along the length of the resilient strip overlies the resilient element, the cam being constrained so as to permit rotational motion about its longitudinal axis, together with a limited motion in a direction normal to the major surface and being such that rotation of the cam causes, by contact between the cam and the spring strip, expansion of the mechanism, and on limitation of expansion, compression of the corrugations in the resilient element.

Such an arrangement, however, suffers the disadvantage that rotation of the cam generally necessitates the use of a tool, such as a screw driver.

It is an object of the present invention to provide a clamp arrangement wherein this disadvantage is overcome.

According to the present invention there is provided a clamp arrangement comprising a board and a mechanism for clamping a marginal portion of the board adjacent an edge between two opposed substantially flat parallel walls, the mechanism being mounted on a major surface of the board adjacent said edge and being capable of expansion in a direction normal to said major surface and including: an elongate resilient element extending in the direction of its length along said marginal portion and having corrugations transverse to its length; and an elongate cam having a longitudinal axis extending along the length of said resilient element and overlying said resilient element; said resilient element and said cam being arranged such that in operation of the mechanism contact between the resilient element and the cam causes said expansion of the mechanism, and on limitation of expansion, compression of the corrugations in the resilient element; the arrangement being characterised in that said cam includes a plurality of cam surfaces along its length, spaced apart by substantially the pitch of said corrugations in said resilient element; and said resilient element and said cam are arranged so as to permit relative sliding movement between said resilient element and said cam in the direction of the length of said resilient element, whereby, by contact between said cam surfaces and said corrugations, said expansion is effected.

In one particular clamp arrangement, said cam is in the form of a substantially rigid metal strip, formed with corrugations of substantially the same pitch as said corrugations in said resilient element.

One clamp arrangement in accordance with the invention will now be described, by way of example only, with reference to the accompanying drawings in which:

FIG. 1 is a partially sectioned plan view of part of a box containing printed circuit boards each provided with two clamp mechanisms the section being along the line I—I in FIG. 3;

FIG. 2 is an elevation of part of a first surface of a printed circuit board provided with a clamp mechanism;

Figure 5:
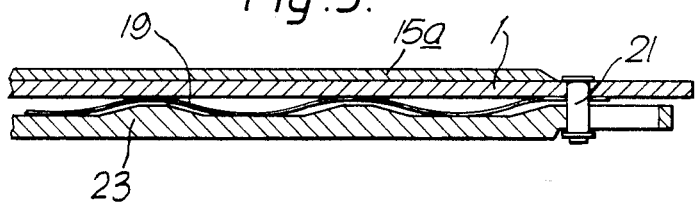
FIG. 5 is a section corresponding to FIG. 4 of a clamp mechanism attached to the other lateral portion of the board.

In all of the figures, except FIG. 5, the clamp arrangements are shown in an operative state.

Referring firstly particularly to FIG. 1, the printed circuit boards 1 are disposed in parallel spaced relationship in the box 3. The lateral marginal portions of each board are located in guide means in the form of slots 5 defined between adjacent pairs of ribs 7a formed on opposed side walls 7 of the box, the ribbed side walls constituting cold walls for dissipating heat generated by electronic components 9 mounted on a first major surface 11 of the board, and also providing physical support for the board. At the bottom of each board there is provided an electrical connector (not shown) which mates with a complementary connector (not shown) in the base (not shown) of the box. The box 3 is provided with a lid 3a, which can only be fitted when the board clamp arrangements are all operated, as further described below.

To aid heat dissipation, as best shown in FIG. 2, the surface 11 of each board carries a heat conductive ladder, the cross members 15b of which lie in close proximity to the electronic components 9, and the side members 15a of which extend along the lateral marginal portions of the surface 11.

Figure 3:
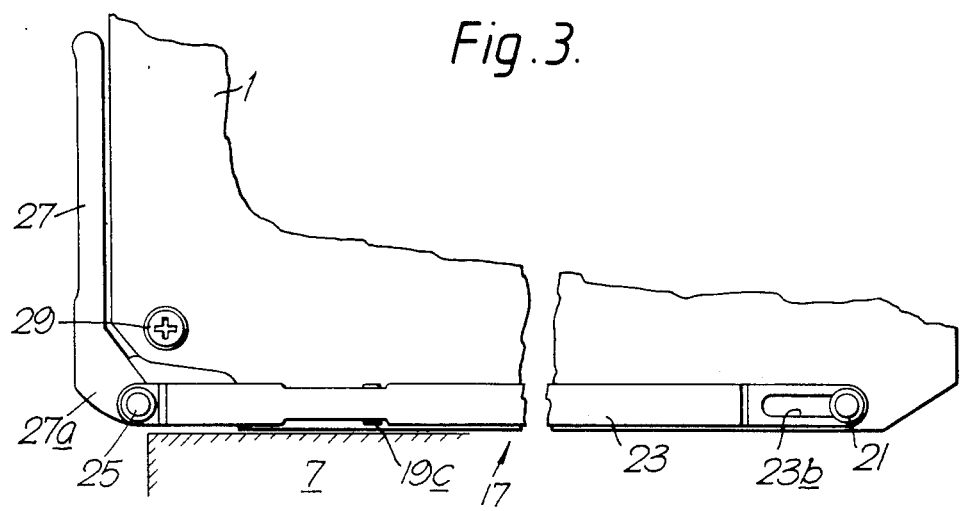
FIG. 3 is an elevation of the reverse surface of the board of FIG. 2.
Figure 4:
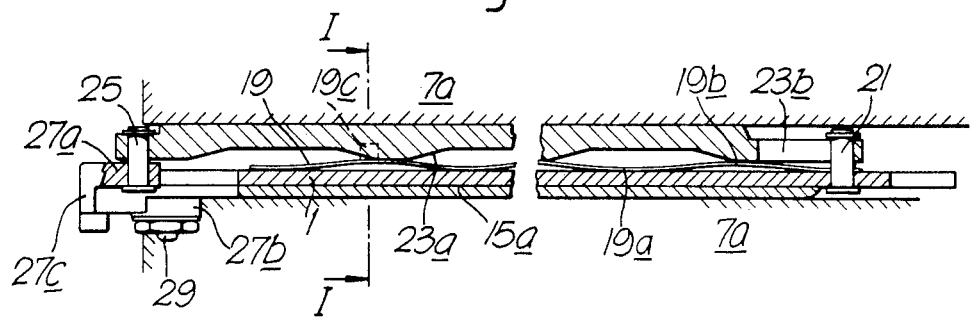
FIG. 4 is a section on IV—IV of FIG. 2.

Referring now also to FIGS. 3 and 4, in respect of each marginal surface carrying a side member 15a there is provided a mechanism 17 which is connected to the board 1 and extends along a corresponding margin of the reverse major surface of the board 1.

Each mechanism 17 includes a wave-shaped resilient metal element 19 which extends longitudinally along the original surface of the board 1 and is secured at one end to the board by a pin 21 which passes through the board, the element 19 being arranged such that it alternately approaches at regions 19a and departs from at regions 19b the marginal surface. Overlying the element 19 is an elongate cam 23 provided along its length with a series of cam surfaces 23a spaced apart by the pitch of the waves in the element 19, the cam being orientated such that the cam surfaces 23a are directed towards the element 19. At one end of the cam there is formed a slot 23b through which the pin 21 extends such the cam is slidably connected to the board, with a small amount of movement of the cam in a direction normal to the major surface 11 of the board also being allowed. The other end of the cam 23 is pivotally attached by a pin 25 to a nose portion 27a of a level 27 the lever having a further nose portion 27b on the opposite side of the board 1 which is pivotally attached by a pin 29 to the board 1. Two ear portions 19c formed on the element 19 engage the sides of the cam 23 thus preventing lateral movement of the free end of the element.

Operation of the clamp arrangement is best understood with reference to FIGS. 3, 4 and 5. To operate the clamp the lever 27 is rotated about its pivot to the position shown in FIG. 3 in which the major part of the lever 27 lies flat with the adjacent edge of the board 1, and transverse to the mechanism 17. Rotation of the lever to this position causes the nose portion 27a of the lever to move to a position level with the top of the board 1, thus pulling the cam member 23 away from pin 21 so that the pin 21 lies at the further end of the slot 23b formed in the cam as shown in FIGS. 3 and 4. The element 19 and the cam 23 are so positioned along the marginal portion of the board 1, that this causes the cam surfaces 23a to ride onto the portions 19b of the element 19 furthest from the board 1, the element being constrained by board 1 thus becoming compressed. The resultant compression of the element 19 reacting through the cam 23 urges the cam into contact with the adjacent rib 7am the side member 15a of the heat conductive ladder on the surface 11 of the board being simultaneously urged into intimate contact with its adjacent rib 7a. The necessary expansion of the mechanism is provided for by the cam riding up on the pins 21, 25 under the pressure of the compressed element 19.

To disengage the mechanism, the lever 27 is rotated in the opposite sense away from the board 1. As the lever rotates the nose portion 27a the lever moves relative to the board 1, thus pushing the cam 23 along the board 1 to a position where the pin 21 lies at the nearer end of the slot 23b. This sliding movement of the cam disengages the cam surfaces 23a from the regions 19b of the element 19 and pushes them into the troughs 19a between the regions 19b. Thus the pressure on the element is released, and the mechanism contracts. Continued rotation of the lever 27 away from the edge of the board 1 causes the further nose portion 27c on the lever to engage with the top of the adjacent side wall 7 of the base, thus producing a levering action which assists in the extraction of the electrical connector at the base of the board 1 from the mating connector in the base of the box. This then enables the board 1 to be removed from the box.

Figure 6:
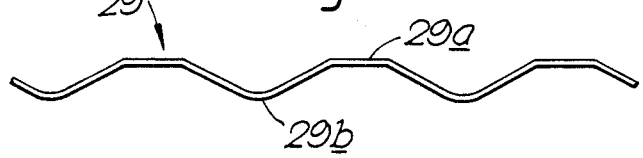
FIG. 6 is a side view of an alternative cam member for use in the arrangement.

FIG. 6 illustrates an alternative cam for use in the mechanism described above. The cam 29 shown in FIG. 6 comprises a substantially rigid metal strip having a series of corrugations of the same pitch as those in the element 19. The portions 29a of the element are formed with flat surfaces arranged to bear on the side wall 7a when the clamp arrangement is in an operative condition, whilst the surfaces 29b are curved to facilitate their riding onto the adjacent uppermost portions of the element 19 when the clamp arrangement is operated. It will be appreciated that a cam of this type has particular application in situations where it is required to minimise the weight of the clamp arrangement, e.g. in an aircraft.

It is a feature of the mechanism described hereinbefore that the position of the lever 27 provides an indication of whether the clamp is operative i.e. whether the lateral portion of the board is maintained in close contact with the cold wall rib 7a. It will also be appreciated as best shown in FIG. 2, the box lid 3a cam only be fitted when the clamp is operative, i.e. the lever 27 lies along the top of the board 1.

I claim:

1. A clamp arrangement comprising a board and a mechanism for clamping a marginal portion of the board adjacent an edge between two opposed substantially flat parallel walls, the mechanism being mounted on a major surface of the board adjacent said edge and being capable of expansion in a direction normal to said major surface and toward one of said flat parallel walls, said arrangement including: an elongate resilient element extending in the direction of its length along said marginal portion of said board and having corrugations transverse to its length, means for substantially non-slidably securing said resilient element to said board, said element by virtue of said corrugations spaced from and adjacent said major surface of the board adjacent said edge; and an elongate rigid cam having a longitudinal axis extending along the length of said resilient element and overlying said resilient element on the side of said element opposite from the side facing said major surface of the board; said resilient element and said cam being arranged such that in operation of the mechanism contact between the resilient element and the cam causes said expansion of the element toward said one of said flat parallel walls, and on limitation of expansion, compression of the corrugations in the resilient element and resulting pressure by said resilient element against the marginal portion of the board to force the board against said one of said flat parallel walls; said cam including a plurality of cam surfaces along its length, spaced apart by substantially the pitch of said corrugations in said resilient element; wherein the improvement includes means mounting said cam for sliding movement relative to said resilient element in the direction of the length of said resilient element between a position in which said cam surfaces are disaligned from those corrugations which are spaced from the board to a position wherein the cam surfaces engage the corrugations spaced from the major surface of the board in which latter position the cam surfaces effect the aforesaid expansion of said mechanism.

2. A clamp arrangement comprising a board and a mechansim for clamping a marginal portion of the board adjacent an edge between two opposed substantially flat parallel walls, the mechanism being mounted on a major surface of the board adjacent said edge and being capable of expansion in a direction normal to said major surface and including: an elongate resilient element extending in the direction of its length along said marginal portion and having corrugations transverse to its length; and an elongate cam having a longitudinal axis extending along the length of said resilient element and overlying said resilient element; said resilient element and said cam being arranged such that in operation of the mechanism contact between the resilient element and the cam causes said expansion of the mechanism, and on limitation of expansion, compression of the corrugations in the resilient element; said cam including a plurality of cam surfaces along its length, spaced apart by substantially the pitch of said corrugations wherein the improvement includes a lever means pivoted to said board's first securing means for slidably securing said cam to said board, and second securing means for substantially non-slidably securing said resilient element to said board, said lever means including means for causing relative sliding movement between said resilient element and said cam in the direction of the length of said resilient element, whereby by contact between said cam surfaces and said corrugations, said expansion is effected.

3. A clamp arrangement according to claim 2 in which one end of said cam is pivoted to part of said lever means.

4. A clamp arrangement according to claim 2 in which said first securing means is a pin and slot arrangement.

5. A clamp arrangement according to claim 2 in which said two flat walls are part of a box for holding said board, said box having a lid, and said lever preventing the lid of said box being fitted when said mechanism is not operative.

6. A clamp arrangement according to claim 2 in which said resilient element lies between said board and said cam.

7. A clamp arrangement according to claim 2 in which said resilient element is a wave-shaped strip.

8. A clamp arrangement according to claim 2 in which said cam is in the form of a substantially rigid metal strip having corrugations of substantially the same pitch as said corrugations in said resilient element.

9. A mechanism for clamping a marginal portion of a board adjacent an edge between two opposed substantially flat parallel walls, the mechanism being mountable on a major surface of the board adjacent said edge and being capable of expansion in a direction normal to said major surface and including: an elongate resilient element having corrugations transverse to its length; and an elongate cam having a longitudinal axis extending along the length of said resilient element and overlying said resilient element; said resilient element and said cam being arranged such that in operation of the mechanism contact between the resilient element and the cam causes said expansion of the mechanism, and on limitation of expansion, compression of the corrugations in the resilient element; said cam including a plurality of cam surfaces along its length, spaced apart by substantially the pitch of said corrugations in said resilient element; wherein the improvement includes a lever means pivotable to said board, first securing means for slidably securing said cam to said board, and second securing means for substantially non-slidably securing said resilient element to said board, said lever means including means for causing relative sliding movement between said resilient element and said cam in the direction of the length of said resilient element, whereby by contact between said cam surfaces and said corrugations, said expansion is effected.

* * * * *